United States Patent [19]

Meyers

[11] 4,287,595

[45] Sep. 1, 1981

[54] ADAPTIVE DELTA-MODULATION NETWORK

[75] Inventor: Charles Meyers, Herten, Luxembourg

[73] Assignee: Te Ka De Felten & Guilleaume Fernmeldeanlagen GmbH, Nuremberg, Fed. Rep. of Germany

[21] Appl. No.: 88,867

[22] Filed: Oct. 29, 1979

[30] Foreign Application Priority Data

Nov. 11, 1978 [LU] Luxembourg ..................... 2849001

[51] Int. Cl.³ .......................................... H03K 7/00
[52] U.S. Cl. ................................. 375/28; 332/11 D
[58] Field of Search ......................... 375/30, 28, 16; 332/11 D

[56] References Cited

U.S. PATENT DOCUMENTS

| 3,638,219 | 1/1972 | Harms | 375/28 |
| 3,781,685 | 12/1973 | Ching | 375/30 |
| 3,822,404 | 7/1974 | Croisier et al. | 375/28 |
| 4,110,705 | 8/1978 | Crouse | 332/11 D |

OTHER PUBLICATIONS

Hallett, R. J., et al., "Delta Modulation Coding with Nonuniform Adaptive Companding", *IBM Tech. Disclosure Bull.*, vol. 22, No. 1.

*Primary Examiner*—Glen R. Swann, III
*Attorney, Agent, or Firm*—Michael J. Striker

[57] ABSTRACT

In an adaptive delta modulation system, the delta modulated output signal is applied to a logic circuit which derives from such signal a pulse train used to develop the system's quantization step-size control voltage. The output pulse train of the logic circuit is applied to a circuit which serves the function of an integrator although digital in operation. The digital circuit develops a digital output signal whose value depends upon the number of pulses appearing per unit time in the logic circuit output pulse train. The digital circuit includes a forwards-backwards counter, whose forwards input receives the logic circuit output pulse train. An accumulator which accumulates the count on the counter produces carry pulses at its highest-place stage, the carry pulses having a repetition frequency corresponding to the count on the counter, the carry pulses being applied to the reverse input of the counter. The count on the counter corresponds to the number of pulses appearing per unit time in the logic circuit output pulse train and is applied to a digital-to-analog converter, from the analog output signal of which the quantization step-size control voltage is derived.

12 Claims, 6 Drawing Figures

ADAPTIVE DELTA-MODULATION NETWORK

BACKGROUND OF THE INVENTION

The present invention concerns circuits used to implement an integrating function and utilizable in adaptive delta modulation systems for companding purposes. Adaptive delta modulation is a familiar technique not requiring extensive review here, but reference may be had if necessary to e.g. the publication "Philips Technische Rundschau," 1970/71, No. 11/12, pp. 351-370.

In order to implement companding in a adaptive delta modulation system, it is conventional to vary the system's quantization step-size in dependence upon a control voltage derived from the delta-modulated output signal of the system. Such a control voltage is obtained using a logic circuit which receives the output pulses of the delta-modulation transmitter and in turn produces pulses whose repetition rate or frequency is a measure of the slope of the analog input signal received at the input of the delta modulation system. The pulses produced at the output of such logic circuit are applied to the input of an integrating circuit, and the latter produces at its output the quantization-step-size control voltage desired.

FIG. 1 schematically depicts a delta modulation transmitter in which companding is effected in accordance with such principle. The transmitter includes a difference or subtractor stage Di, one input of which receives the analog input signal w to be delta modulated. The other input of difference stage Di receives the approximation signal or reconstructed signal g of the system. The difference or error signal $e = w - g$ produced at the output of difference stage Di is applied to a comparator S. The comparator S produces at its output a signal indicative of the sign (polarity) of the difference signal e. A sampling stage K, here a bistable circuit, samples this sign information with a sampling frequency fa. At the output of the sampling stage K there is produced the delta modulated signal d actually to be transmitted. The delta modulated signal d, in addition to being applied to whatever transmission channel L is employed, is applied to the input of a logic circuit LE, and also via a pulse converter IW to an input M1 of a multiplier M. The pulses produced at the output of logic circuit LE are applied to the input of an integrating circuit IN. The control voltage Us produced at the output of integrating circuit IN is applied to one input of an adding stage Ad, whose other input receives a voltage ΔU which is added onto the control voltage Us. This voltage ΔU corresponds to the smallest quantization step-size which appears in the case that Us=0. The output signal Us+ΔU of the adding stage Ad is applied to an input M2 of multiplier M and serves to weight the constant-amplitude bipolar pulses produced at the output of pulse converter IW. The weighted-amplitude pulses produced at the output of multiplier M are applied to the input of an integrator I, at whose output the approximation signal g is produced, the latter being compared in difference stage Di against the analog input signal w.

The integrating circuit IN can, at simplest, be a simple RC low-pass filter. The time constant of such RC filter is dimensioned in correspondence to the characteristics of the type of analog input signal w to be employed. For example, when the input signal is always to be an analog speech signal, it is customary to assume that the amplitude of the speech signal's envelope will remain approximately constant within a time interval having the duration of one spoken syllable. During such time interval, accordingly, the quantization step size employed should vary at most only slightly. From such requirement it follows that the time constant for the RC low-pass filter should have a value of a few milliseconds. However, a capacitor capable of implementing such a time constant would require a large capacitance value, would be of unwieldy dimensions and could not be implemented in integrated-circuit technique.

SUMMARY OF THE INVENTION

It is an object of the invention to provide a circuit capable of producing such quantization step size control voltage Us from the pulses received from the output of the aforementioned logic circuit, but which does not require any such large-capacitance capacitor although able to provide substantially the same action as an integrating circuit comprised of an RC low-pass filter.

In accordance with the presently preferred embodiment of the invention, the pulse train produced at the output of the aforementioned logic circuit is applied to the forwards input of a forwards-backwards counter, the backwards input of which receives pulses from the output of an accumulator, the number of accumulator output pulses produced per unit time being proportional to the present count on the forwards-backwards counter, with the quantization step size control voltage Us being derived using a digital-to-analog converter operative for converting the count on the counter into a corresponding analog voltage.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawing.

DESCRIPTION OF THE PREFERRED EMBODIMENTS

Figure 1:
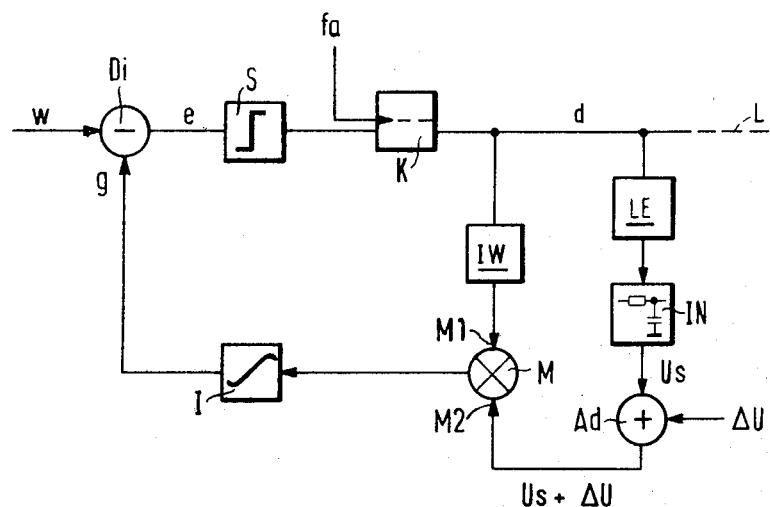
FIG. 1 is a schematic diagram illustrating the conventional configuration of an adaptive delta modulation system.
Figure 2:
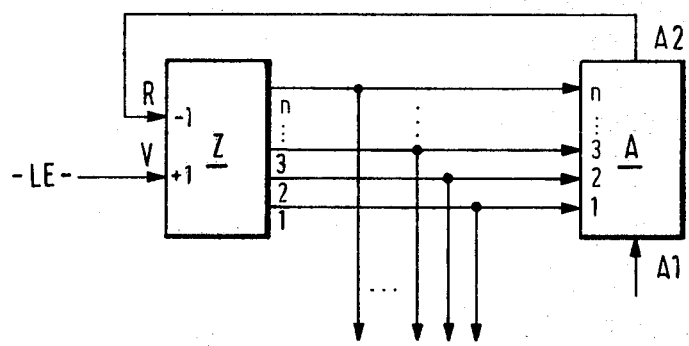
FIG. 2 is a schematic block diagram illustrating the configuration of the circuit used, in accordance with the present invention, to derive the quantization step-size control voltage from the output pulse train of the logic circuit LE of FIG. 1.

In accordance with the present invention, instead of using in the conventional adaptive delta modulation configuration of FIG. 1 an RC low-pass filter for the integrating circuit IN thereof, use is made of a circuit configuration such as depicted in FIG. 2, by way of example. The circuit of FIG. 2 comprises a forwards-backwards counter Z and an accumulator A. The output pulses of the logic circuit LE of FIG. 1 are applied to the forwards input V of the counter Z, each such pulse causing the count on counter Z to advance by one count; this is indicated in FIG. 2 by the legend "+1". Counter Z comprises n stages and has n outputs, successively higher-place ones of which are denoted by the successively higher numerals 1, 2, ..., n. Each of the n counter outputs, on the set of which the counter's count appears as an n-bit number, is connected to a corresponding input of an n-stage accumulator A. Accumulator A comprises an n-stage parallel adder and a storage having a capacity of n bits. Except for the lowest-place stage (stage 1) of the parallel adder, all its stages (stage 2 ... stage n) are full adders. Inasmuch as stage 1 of the parallel adder receives no carry signal, it is provided as a half adder. Each full (or half) adder has a first input "a" and a second input "b", each of the "a" inputs receiving a respective bit of a first binary number and each of the "b" inputs receiving a respective bit of a second binary number. The "a" inputs of the adders constitute the n inputs of the accumulator A; as already stated, these receive the count z of counter Z, in parallel form, as an n-bit number. Each bit storage location of the n-bit storage of accumulator A stores a respective bit of an n-bit number. In particular, each bit storage location of the n-bit storage receives a respective bit from a respective one of the n outputs of the parallel adder. The storage internal to accumulator A is clocked. Each time the n-bit storage receives a clock signal, there is performed an addition of the present count z of counter Z and the n-bit number which the n-bit storage registered in response to the preceding such clock signal. Depending upon the magnitude of the count z on counter Z, this repeated addition process, after a varying number of such clock pulses, results in the production of a carry signal by the highest-place stage (stage n) of the accumulator's parallel adder, this carry signal appearing on output A2 of accumulator A. From this mode of operation, it follows that the number of carry signals produced on accumulator output A2 per unit time is proportional to the count on counter Z. Each of these carry signals is applied to the reverse input R of counter Z and causes the count z to decrease by one; this is indicated in FIG. 2 by the legend "−1". The clock signals for the accumulator's n-bit storage are applied to input A1 of the accumulator.

(Typically, the two inputs V and R of counter Z will not receive their input pulses directly from the logic circuit LE and accumulator A, but instead through the intermediary of a clocked control logic stage which responds to the receipt of a V or R input pulse not by immediately advancing or reducing the count Z, but instead by assuming an enabled state which permits such count increase or decrease in response to the application of a clock signal to such clocked control logic stage, so that the increase or decrease of count z occur in response to the next clock signal applied to the counter. This familiar technique, which serves to screen the counter from ambiguous response to simultaneous receipt of both a V input pulse and an R input pulse, is well known to persons skilled in the art. For the sake of simplicity, however, it can be assumed, for purposes of description, that the output pulses from logic circuit LE are applied directly to the V input of counter Z, and that the carry pulses from output A2 of accumulator A are applied directly to the reverse-counting input R, and that counter Z responds to them immediately.)

Hereinafter, the pulses applied to the forwards input V of counter Z will be called input pulses, and the accumulator output pulses applied to reverse-counting input R will be called simply carry pulses.

In a steady-state situation, the count z on counter Z is constant (or at most fluctuates slightly). If steady state is lost due to a sudden increase in the number of input pulses V received per unit time, then the count z increases until such time as the number of carry pulses received per unit time again becomes equal to the number of input pulses received per unit time, at which point the new steady state is achieved. If steady state is lost due to a sudden decrease in the number of input pulses received per unit time, then count z decreases until such time as the number of carry pulses received per unit time has decreased to again equal the number of input pulses received per unit time. In the steady state, the count z on counter Z is a measure of the number of input pulses received by the counter per unit time. The quantization step size control voltage Us is derived from the count z by use of a digital-to-analog converter (not shown in FIG. 2) connected to the n outputs of counter Z.

The time-constant behavior of the circuit of FIG. 2 will now be discussed. The repetition frequency of the input pulses is denoted by f and the repetition frequency of the carry pulses by r. If one considers a very short time interval $\Delta t$, but such that $\Delta t \gg 1/f$ and $\Delta t \gg 1/r$, the number of input pulses received by count Z in this time interval is $f \cdot \Delta t$ and the number of carry pulses is $r \cdot \Delta t$. As already stated, in steady-state operation the count z is nominally constant, i.e., $$f \cdot \Delta t - r \cdot \Delta t = 0 \tag{1}$$

Let it be assumed that the steady state is lost due to a sudden increase in the repetition frequency f of the input pulses. The increase $\Delta z$ of count z during the time interval $\Delta t$ is equal to the difference between the number of input pulses and the number of carry pulses received during this time interval, i.e., $$\Delta z = f \cdot \Delta t - r \cdot \Delta t \tag{2}$$

Because the repetition frequency r of the carry pulses is proportional to the count z (even during transitions from one steady-state count to another steady-state count), the carry pulse frequency $r = k \cdot z$, where k is a constant proportionality factor.

Accordingly, equation (2) can be rewritten as:

$$\Delta z = f \cdot \Delta t - k \cdot z \cdot \Delta t \tag{3}$$

Converting equation (3) into a differential equation, one obtains:

$$z' = dz/dt = f - k \cdot z = k(f/k - z) \tag{4}$$

Solving equation (4) for z as a function of time, one obtains:

$$z = (1/k) \cdot f \cdot (1 - e^{-t \cdot k}) + z_0 \cdot e^{-t \cdot k} \tag{5}$$

This function (5) describes the relationship with respect to time of count z when the steady-state value of z is lost due to an abrupt change in the repetition frequency f of the input pulses. $z_0$ is the stead-state value of z at the time the steady-state value is lost, and 1/k is the time-constant of the change from one steady-state value of z to the new steady-state value of z. The exponential relationship set forth in equation (5) corresponds to the behavior of an RC low-pass filter.

Figure 3:
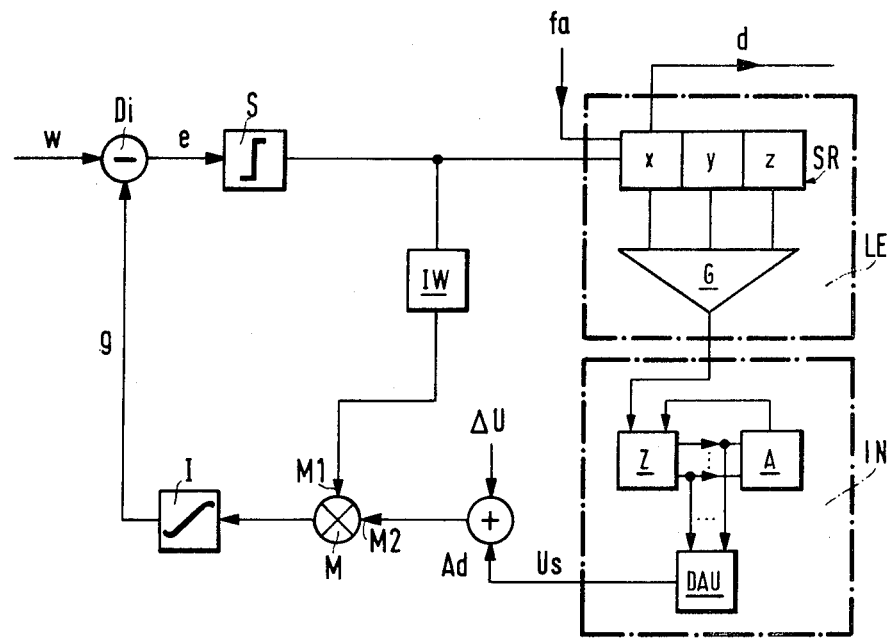
FIG. 3 depicts the circuit of FIG. 2 connected in as part of a delta modulation transmitter.

FIG. 3 depicts an adaptive delta modulation configuration like that of FIG. 1, but with the circuit of FIG. 2 used to implement the function of the integrating circuit IN. The logic circuit LE used in this particular example comprises a shift register SR preferably consisting of three stages. Shift register SR receives shift pulses having a repetition frequency equal to the sampling frequency fa at which the output value of the comparator S is sampled for delta modulation purposes. The outputs of all stages of shift register SR are connected to respective inputs of a coincidence gage G. Gate G produces an output pulse in response to simultaneous receipt of a "1" signal at each and every one of its three inputs, and likewise in response to simultaneous receipt of a "0" signal at each of its three inputs, but in no other case. The output of gate G constitutes the output of logic circuit LE. As already stated, the pulse train produced at the output of logic circuit LE is applied to the forwards input V of the counter Z. The repetition frequency of these input pulses is a measure of the slope of the analog input signal w applied to the input of the delta modulation system. Connected to the n outputs of counter z are respective ones of the n inputs of a digital-to-analog converter DAU, whose analog output signal constitutes the quantization step-size control voltage Us. The magnitude of control voltage Us is proportional to the repetition frequency of the input pulses received at the forwards input V of counter Z. Control voltage Us is applied via adding stage Ad to input M2 of the multiplier M and varies the quantization step size.

In order to even better match the integrating action of integrating circuit IN to the characteristics of the speech signal to be transmitted, it is meaningful to automatically vary the time constant T of the integrating circuit IN towards smaller values in response to increasing excursions of the analog message signal. In the case of an analog integrating circuit IN, this would for example be done using the parallel combination of a capacitor and a diode connected to receive the output pulses from the logic circuit LE; such technique is described, for example, in Federal Republic of Germany published allowed patent application DE-AS No. 23 41 381. The value of the time constant T of such parallel circuit is $T = R_\sim \cdot C$, where C is the capacitance of the capacitor and $R_\sim$ the differential resistance of the diode in its forward-bias direction. Inasmuch as this differential resistance decreases as an exponential function with increasing applied voltage, the time constant T of such integrating circuit will decrease with increasing excursions of the analog speech signal to be delta modulated.

Figure 4:
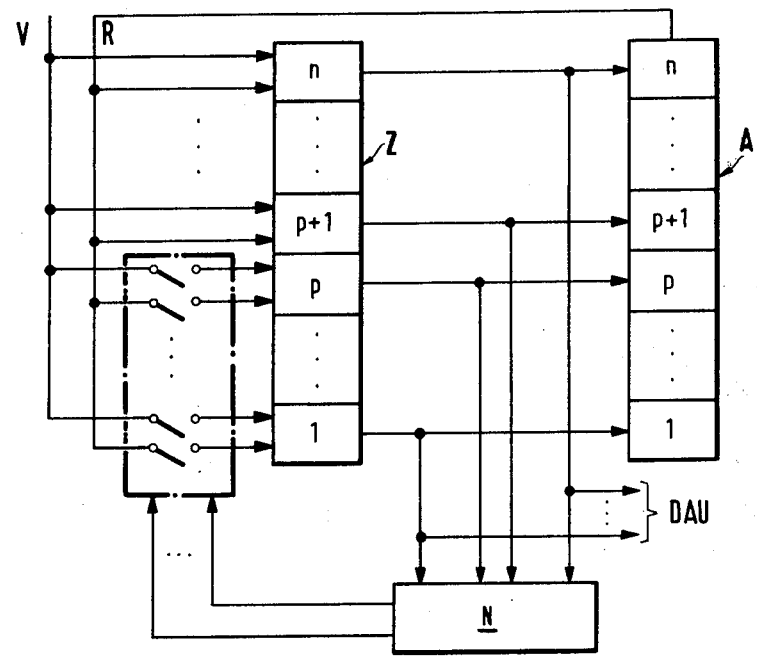
FIG. 4 depicts a modification of the circuit in FIG. 2, such that the equivalent time constant of the circuit depends upon the count of the counter of the circuit.

In contrast to such analog integrating circuit, the circuit of FIG. 2 has a time constant $T = 1/k$, i.e., in accordance with equation (5) above. This value is constant for all slopes of the message signal, i.e., right up to the maximum count which counter Z can achieve. FIG. 4 depicts a modification of the FIG. 2 circuit, in which the time constant T is made dependent upon the slope of the message signal, here made dependent upon the count z on counter Z. In FIG. 4, there is provided a logic circuit N which increasingly weights the pulses applied to the counter inputs V and R as the count z on counter Z increases. In the concrete example here depicted, this increasing weighting is implemented by shutting off the lower-place stages 1,2, ... of counter Z and of accumulator A during the counting action in dependence upon which one of several ranges of counts the present count on counter Z falls into. With lower-place stages shut off during counting, the pulses to be counted are received by the inputs of the remainder of the counting chain. The outputs of the shut off stages of counter Z are held reset with "0" signals persisting at their outputs. However, the place value ($2^0$, $2^1$, $2^2$, ... ) of all stages of the counter and of the accumulator, i.e., both those stages which are shut off and those which remain in use, continue as before. The outputs of the shut off stages of counter Z remain connected to the corresponding inputs of the accumulator A. The logic elements needed for operation of the counter Z are contained within the counter's individual counting stages.

The effect of the expedient just described upon the value of the time constant T will now be explained. Let it be assumed that the p lowest-placed stages of the counter Z are shut off for the counting operation, with the pulses to be counted having an effect on only the remainder of the counting chain. Of such remainder of the counting chain, counter stage p+1 is the lowest-place stage. It will be understood that this is the equivalent of increasing the repetition frequency of both the input pulses and the carry pulses by a factor of $2^p$. Accordingly, for such case, equation (2) converts to:

$$\Delta z = 2^p \cdot f \cdot \Delta t - 2^p \cdot e \cdot \Delta t \tag{6}$$

This equation can be reformulated to assume a form corresponding to that of equation (4) above, i.e., $$z' = dz/dt = 2^p \cdot f - 2^p \cdot k \cdot z = 2^p \cdot k(f/k - z) \tag{7}$$

Solving equation (7) for z as a function of time, one obtains:

$$z = (1/k) \cdot f \cdot (1 - e^{-t \cdot 2^p \cdot k}) + z_0 \cdot e^{-t \cdot 2^p \cdot k} \tag{8}$$

Equation (8) corresponds to equation (5), but with the difference that the time constant involved is no longer $1/k$, but instead is $1/(2^p k)$. Accordingly, if stages 1, ... , p of counter Z are shut off in this way, this has the effect of multiplying the original time constant of the integrating circuit by the factor $\frac{1}{2}^p$.

Figure 5:
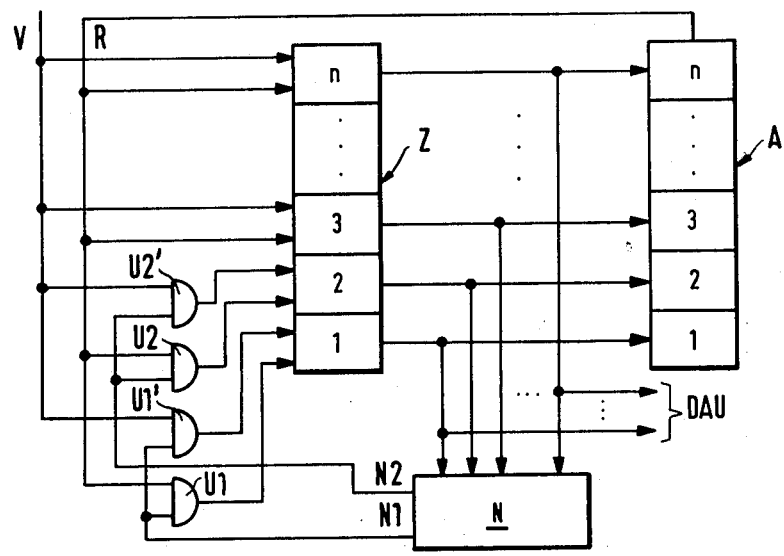
FIG. 5 depicts a particular version of the circuit of FIG. 4.

This will be further illustrated with regard to the circuit configuration shown in FIG. 5. It will be assumed, for explanatory purposes, that p=2. It will furthermore be assumed that the total range of possible counts on counter Z is subdivided into three ranges. The first range, expressed in terms of the maximum count $z_m$, encompasses 0 ... $z_m/16$; the second range encompasses $z_m/16$ ... $z_m/4$; and the third range encompasses $z_m/4$ ... $z_m$. The instantaneous count z on counter Z is continually evaluated by logic circuit N, to ascertain which one of these three ranges the count z falls into. If count z is in the first range, then both outputs N1, N2 of logic circuit N produce output "1" signals and the AND-gates U1, U1' and U2' are enabled for transmission of input pulses and carry pulses. If count z falls into the second range, then only logic circuit output N2 produces a "1" signal, output N1 carrying only a "0" signal. The AND-gates U1 and U1' are not enabled, with the result that stage 1 of counter Z, i.e., the lowest-place stage of the counter, is shut off from the counting operation. The time constant of the circuit now has only one half its original value. If count z falls into the third range, then both outputs N1 and N2 of logic circuit N carry "0" signals. Accordingly, the two AND-gates U2 and U2', too, are disabled, and both stage 1 and stage 2 of counter z are shut off from the counting operation. The time constant of circuit is now only one-fourth its original value.

With the circuit configurations thus far described, it may happen that counter Z will overflow if the repetition rate of the received input pulses greatly enough increases for a substantial length of time. One way to avoid such overflow is to increase the word length or number of stages of counter Z compared to that of the accumulator A by the amount of one bit or one stage. In that case, the output of the highest-place stage of counter Z (stage n+1) is not connected to the accumulator A for transmission of a bit thereto but instead is connected to the reverse counting input R of the counter Z itself. If then a "1" signal appears at the output of stage n+1 of the counter Z, this will occur when the outputs of all the other counter stages are carrying "0" signals. In such case the accumulator A cannot produce any carry signal.

Figure 6:
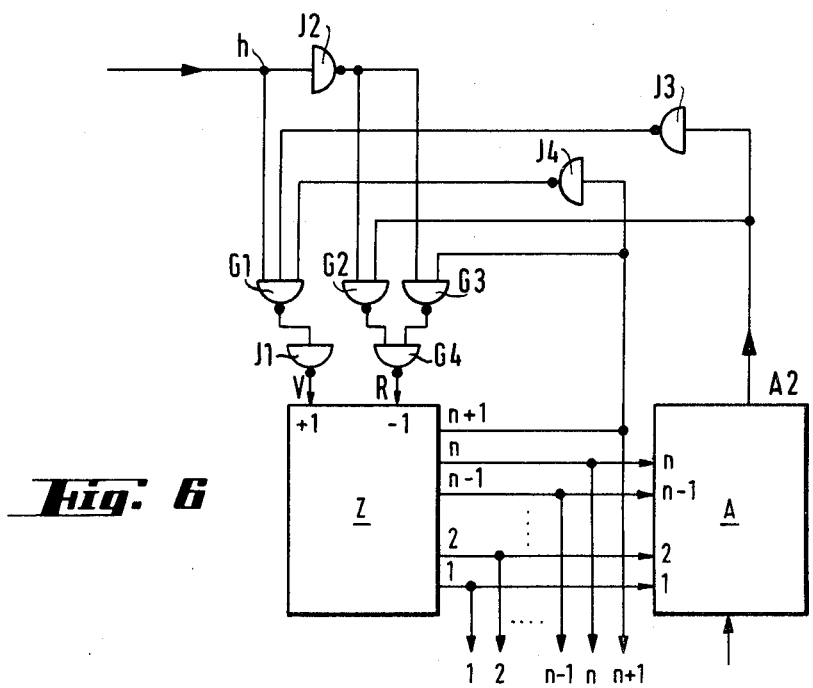
FIG. 6 depicts a modification of the circuit of FIG. 2 designed to avoid overflow of the counter.

FIG. 6 depicts a circuit configuration in which overflow of counter Z is prevented in this way. Here, counter Z has n+1 stages and outputs, but accumulator A only n inputs. The gates G1 ... G4 are here NAND-gates. The input pulses appearing at junction h are transmitted via gate G1 and an inverter J1 to the forwards input V of counter Z. The carry pulses are transmitted via gate G2 and gate G4 to the reverse input R of counter Z. The pulses produced at the output of stage n+1 of counter Z, hereafter referred to as overflow pulses, are likewise transmitted to the reverse input R, via the gates G3 and G4. (In all these cases, a pulse on any particular line has the form of a "1" signal, so that a persisting "0" signal constitutes the absence of a pulse.) The input pulses are transmitted via inverter J2 to respective inputs of the gates G2 and G3. The carry pulses are transmitted via the inverter J3 to a second input of gate G1, and the overflow pulses via an inverter J4 to a further input of gate G1. This logic-gate circuit has the function of the control logic spoken of earlier.

Gate G1 is enabled for transmission of input pulses, if neither carry no overflow pulses are present. In such case, the outputs of the inverters J3 and J4 carry "1" signals. If no input pulses appear, the output of inverter J2 carries a "1" signal. The gate G2, then, is transmissive for the carry pulses and the gate G3 for the overflow pulses. If input pulses and carry or overflow pulses appear simultaneously, the count z on counter z remains unchanged. By means of this expedient, attempts by the counter to simultaneously respond to a forwards-counting pulse and a reverse-counting pulse are avoided.

As an alternative to the configuration depicted in FIG. 6, the counter Z of FIG. 6, instead of having n+1 stages, can have only n stages as before, i.e., the same number of stages as accumulator A. In that event, the recognition of an overflow situation could be implemented by an AND-gate having n inputs each of which is connected to a respective one of the n outputs of the counter Z. The output of such AND-gate would then correspond to the output of stage n+1 of the counter Z of FIG. 6 and, as in FIG. 6, be connected to one input of inverter J4 and to one input of gate G3. With such an alternative configuration, when the maximum count possible is reached, all the outputs of the counter, and therefore also the output of such AND-gate, would carry a "1" signal. As a result, gate G1 would be non-transmissive for the input pulses and counter Z would be locked at this maximum count, even if a further increase in the repetition rate of the input pulses were to develop, until such time as the repetition rate of the input pulses drops down to a value below the value corresponding to such maximum count.

It will be understood that each of the elements described above, or two or more together, may also find a useful application in other types of circuit configurations and integrating procedures differing from the types described above.

While the invention has been illustrated and described as embodied in a circuit which performs an integrating or totalizing action for development of the quantization step size control voltage of an adaptive delta modulation system, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A circuit operative for developing a signal which is proportional to the number of pulses appearing per unit time in a pulse train, the circuit comprising a forwards-backwards counter having a forwards input and a backwards input, said forwards input of the counter receiving the pulses of a first pulse train; means responsive to the count on the counter and applying to said backwards input of the counter a second pulse train, the number of pulses contained in the second pulse train per unit time varying in proportion to the count on the counter; and digital-to-analog converter means receiving the count on the counter and converting the count into a corresponding analog signal whose value indicates the number of pulses appearing per unit time in the first pulse train.

2. The circuit defined in claim 1, said means applying the second pulse train comprising an accumulator which accumulates the count on the counter and produces carry pulses which form the second pulse train.

3. The circuit defined in claim 1, furthermore including means operative in dependence upon the count on the counter for automatically disabling one or more lowest-place stages of the counter so as to increase the numerical value by which the count changes in response to each pulse received by the counter.

4. The circuit defined in claim 2, the counter having a number of stages exceeding by one the number of stages of the accumulator, furthermore including means responding to pulses produced at the highest-place stage of the counter by preventing the counter from changing count in response to the pulses of the first pulse train.

5. The circuit defined in claim 2, furthermore including means responding to the count on the counter reaching a predetermined maximum value by preventing the counter from changing count in response to the pulses of the first pulse train.

6. In an adaptive delta modulation system of the type which produces a delta-modulated output signal and which includes means varying the quantization step size of the system as a function of a received control voltage and which also includes logic circuit means receiving the delta-modulated output signal and operative for deriving therefrom a pulse train used to develop the control voltage, an arrangement for deriving the control voltage from the pulse train, the arrangement comprising digital circuit means receiving the pulse train and producing a digital output signal whose value corresponds to the number of pulses appearing per unit time in the pulse train, and means deriving the control voltage from the digital output signal.

7. In an adaptive delta modulation system as defined in claim 6, the digital circuit means including counting means generating a count dependent upon the number of pulses appearing per unit time in the pulse train.

8. In an adaptive delta modulation system as defined in claim 6, the digital circuit means including a forwards-backwards counter having a forwards input and a backwards input, said forwards input of the counter receiving said pulse train, said pulse train being a first pulse train; and means responsive to the count on the counter and operative for applying to said backwards input of the counter a second pulse train, the number of pulses contained in the second pulse train per unit time varying in proportion to the count on the counter, said means for deriving the control voltage including digital-to-analog converter means receiving the count on the counter and deriving therefrom a corresponding analog signal.

9. In a system as defined in claim 8, said means applying the second pulse train comprising an accumulator which accumulates the count on the counter and produces carry pulses which form the second pulse train.

10. In a system as defined in claim 8, furthermore including means operative in dependence upon the count on the counter for automatically disabling one or more lowest-place stages of the counter so as to increase the numerical value by which the count changes in response to each pulse received by the counter.

11. In a system as defined in claim 9, the counter having a number of stages exceeding by one the number of stages of the accumulator, furthermore including means responding to pulses produced at the highest-place stage of the counter by preventing the counter from changing count in response to the pulses of the first pulse train.

12. In a system as defined in claim 9, furthermore including means responding to the count on the counter reaching a predetermined maximum value by preventing the counter from changing count in response to the pulses of the first pulsetrain.

* * * * *